(12) United States Patent
Shinmura et al.

(10) Patent No.: US 7,208,678 B2
(45) Date of Patent: Apr. 24, 2007

(54) ELECTRONIC COMPONENT HOUSING STRUCTURAL BODY

(75) Inventors: Osamu Shinmura, Toyota (JP); Tatsuyuki Uechi, Toyoake (JP)

(73) Assignees: Toyota Jidosha Kabushiki Kaisha, Toyota (JP); Aisin AW Co., Ltd., Anjo (JP)

( * ) Notice: Subject to any disclaimer, the term of this patent is extended or adjusted under 35 U.S.C. 154(b) by 0 days.

(21) Appl. No.: 11/371,107

(22) Filed: Mar. 9, 2006

(65) Prior Publication Data
US 2006/0207780 A1 Sep. 21, 2006

(30) Foreign Application Priority Data
Mar. 17, 2005 (JP) ............................. 2005-076460

(51) Int. Cl.
*H02G 3/08* (2006.01)
(52) U.S. Cl. ............... 174/50; 174/17 R; 174/520; 439/76.1; 439/76.2
(58) Field of Classification Search ............ 174/50, 174/52.1, 53, 57, 58, 50.5, 52.3, 17 R, 17 CT, 174/520, 521, 539; 439/76.1, 76.2, 949, 439/535, 536, 537, 538, 539; 361/600, 601, 361/641, 752; 277/590, 910, 368, 369, 375
See application file for complete search history.

(56) References Cited

U.S. PATENT DOCUMENTS 4,664,281 A * 5/1987 Falk et al. ................... 174/50
5,245,507 A * 9/1993 Ericksen ...................... 361/641
6,034,876 A * 3/2000 Ohno et al. .................. 439/76.1
6,309,257 B1 * 10/2001 Huang ......................... 174/50.5
6,455,768 B2 * 9/2002 Negishi ................... 174/17 CT
6,545,217 B2 * 4/2003 Sato ............................ 174/50
6,740,809 B2 * 5/2004 Vacheron ..................... 174/50
6,831,222 B2 * 12/2004 Pastuch .................. 174/17 CT
6,852,924 B2 * 2/2005 Lessard ....................... 174/50
6,911,598 B2 * 6/2005 Onizuka et al. .............. 174/50

FOREIGN PATENT DOCUMENTS

| JP | A 09-121557 | 5/1997 |
| JP | A 10-213366 | 8/1998 |
| JP | A 2003-101277 | 4/2003 |
| JP | A 2004-128099 | 4/2004 |
| JP | A 2005-032830 | 2/2005 |

* cited by examiner

*Primary Examiner*—Angel R. Estrada
(74) *Attorney, Agent, or Firm*—Oliff & Berridge, PLC (57) ABSTRACT

An electronic component housing structural body includes a first housing body accommodating electronic components and a second housing body accommodating electronic components. Fitting plane of the first and second housing bodies include a liquid passage area and a communicating passage area. The liquid passage area includes a cooling passage in which cooling liquid flows. The communicating passage area includes a communicating passage that connects housing chambers of the first and second housing bodies. Furthermore, a single sealing member is disposed on the fitting plane to independently surround and seal the liquid passage area and the communicating passage area.

3 Claims, 5 Drawing Sheets

RELATED ART

Fig. 5

ELECTRONIC COMPONENT HOUSING STRUCTURAL BODY

CROSS-REFERENCE TO RELATED APPLICATION

The entire disclosure of Japanese Patent Application No. 2005-76460 including the specification, claims, drawings and abstract is incorporated herein by reference.

BACKGROUND OF THE INVENTION

1. Field of the Invention

The present invention relates to a structural body accommodating electronic components, and more particularly to a sealing structure applied to a housing chamber in which electronic components are accommodated and also applied to a cooling passage formed in a structural body to cool the electronic component.

2. Description of the Related Art

Electronic components and electronic units or assemblies accommodating numerous electronic components tend to generate a great amount of heat. For example, an automotive vehicle equipped with a hybrid power plant (i.e., a combined electric motor/internal combustion engine) or an electric vehicle is subjected to a significant amount of heat generated from electronic components constituting an inverter device or a converter device. The electronic components are generally accommodated in a structural body including a metallic housing body. Furthermore, the structural body usually includes a cooling passage in which coolant flows and heat dissipating fins to cool the heated electronic components.

Figure 5:
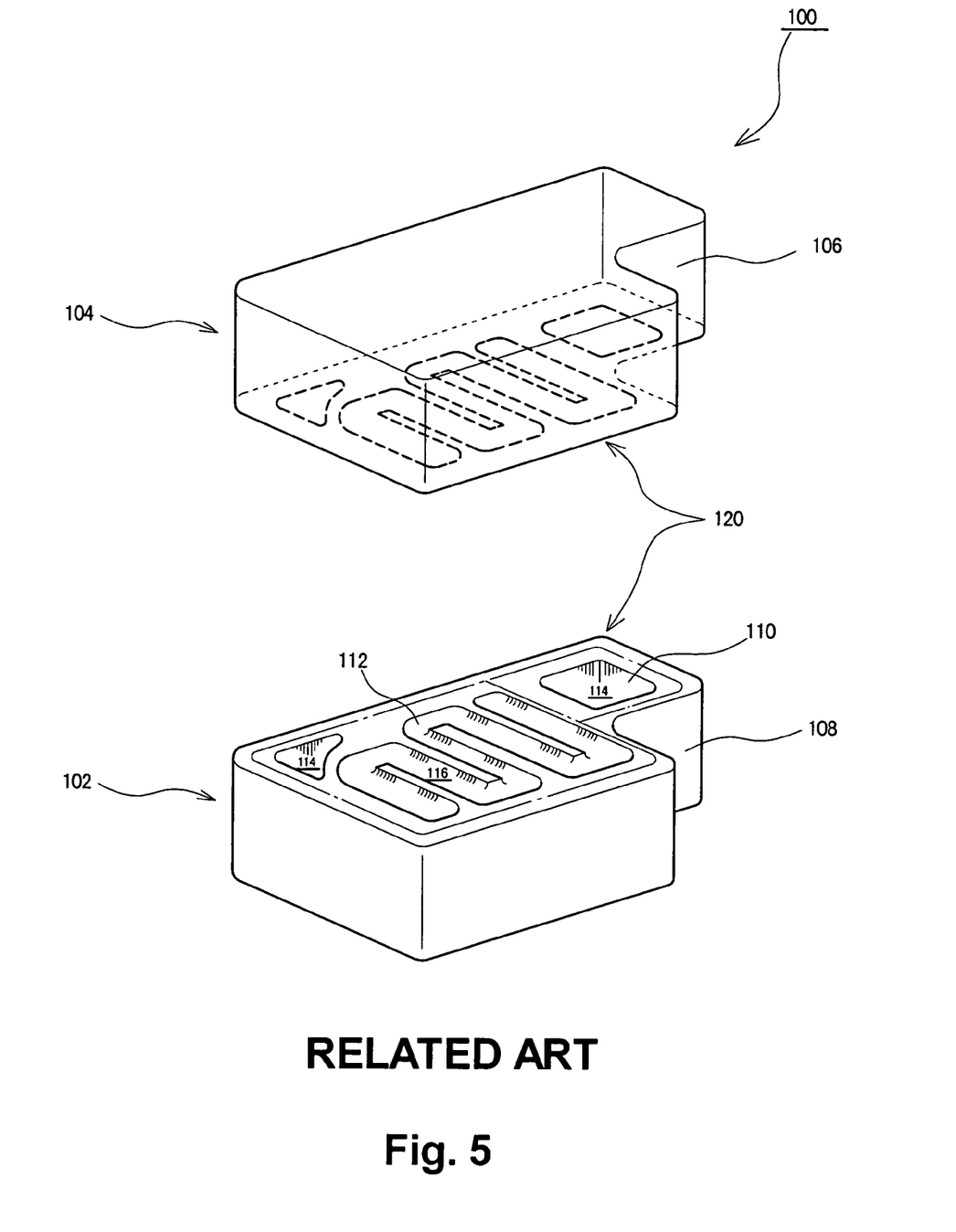
FIG. 5 is an exploded perspective view showing a schematic arrangement of a conventional structural body accommodating electronic components.

FIG. 5 shows a conventional structural body configured to accommodate electronic components. A power control unit 100 is a device that can control electrical power supplied to a hybrid power plant. The power control unit 100 includes a boosting converter section 102 and a driving inverter section 104 mounted on the boosting converter section 102. The boosting converter section 102 boosts a DC voltage supplied from a battery. The driving inverter section 104 converts a boosted DC voltage into an AC voltage and supplies the converted AC voltage to the electric motor.

The driving inverter section 104 includes electronic components (not shown) constituting an inverter device and an inverter housing body 106 accommodating the electronic components. The inverter housing body 106 has a housing chamber in which the electronic components are installed. The electronic components are fixed to the housing body 106 by means of bolts or the like. Similar to the inverter section 104, the boosting converter section 102 includes a converter housing body 108 having a housing chamber in which electronic components are installed.

The housing chamber of the inverter housing body 106 and the housing chamber of the converter housing body 108 can be connected via a communicating passage 110 when the boosting converter section 102 and the driving inverter section 104 are assembled together. The communicating passage 110 provides a space in which bus bars and a wiring harness can extend to connect the electronic components of the inverter device and the electronic components of the converter device. The bus bars and the wiring harness can supply a boosted electrical power from the converter to the inverter. For example, there is a possibility of a high voltage of 600 V being applied to the bus bars and the wiring harness. Accordingly, to eliminate leakage of the electrical power, the communicating passage 110 must have sufficient water-proof properties.

Furthermore, the power control unit 100 includes a cooling passage 112 in which coolant flows to cool the electronic components installed in the housing chambers. The cooling passage 112 consists of two side walls, one of which is formed on the inverter housing body 106 and the other is on the converter housing body 108. More specifically, joining surfaces 120 of the housing bodies 106 and 108 are partly recessed into a predetermined groove shape to form the side walls of the cooling passage 112. The cooling passage 112 can be formed when the inverter housing body 106 and the converter housing body 108 are coupled or assembled at their joining surfaces 120. In general, cooling water flows as the coolant in the cooling passage 112 and circulates in a radiator installed in an automotive vehicle.

As described above, the joining surfaces 120 are defined as boundary surfaces of the housing bodies 106 and 108 in a coupled or assembled condition. The joining surfaces 120 include a communicating passage area 114 where the communicating passage 110 is provided and a liquid passage area 116 where the cooling passage is provided. As described above, the communicating passage 110 formed in the communicating passage area 114 must have sufficient water-proof properties. Meanwhile, the cooling water flows in the cooling passage provided in the liquid passage area 116. Thus, the communicating passage area 114 requiring water-proof properties and the liquid passage area 116 including the cooling passage must be independently sealed.

The communicating passage area 114 must be sealed considering not only the cooling water entering from the liquid passage area 116 but also the external water entering from the outside of the structural body. On the other hand, the liquid passage area 116 must be sealed considering not only the cooling water flowing into the communicating passage area 114 but also the cooling water leaking out of the housing body. Preventing the cooling water from leaking out of the structural body facilitates realizing a reliable cooling system that can stably maintain a sufficient amount of cooling water circulating to cool the electronic components.

To this end, a sealing surface having a predetermined surface roughness is formed at a portion indicated by an alternate long and short dash line in FIG. 5. The sealing surface can independently seal the communicating passage area 114 and the liquid passage area 116 at the joining surfaces 120 of two housing bodies 106 and 108. More specifically, the sealing surface is formed on the joining surface(s) 120 of the housing bodies to independently surround the communicating passage area 114 and the liquid passage area 116.

A liquid gasket agent containing silicone rubber and other components, so-called FIPG (Formed in place gasket), is conventionally coated or applied on the sealing surfaces before the housing bodies are coupled. FIPG (i.e., liquid gasket agent) can enhance sealing properties of an inner clearance between the communicating passage area 114 and the liquid passage area 116. When a sufficient amount of FIPG hardens between the sealing surfaces of coupled housing bodies 106 and 108, FIPG can eliminate the cooling water leaking out of the liquid passage area 116 and the water entering from the outside of the structural body. Thus, no water can enter into the communicating passage area 114. Furthermore, FIPG can eliminate the cooling water leaking out of the liquid passage area 116 to the outside.

However, in the conventional electronic component housing structural body, various problems occur due to the use of FIPG that can assure sealing properties. More specifically, in manufacturing processes, workers must carefully and uniformly apply a predetermined amount of FIPG on the sealing surface(s). Applying the FIPG on the sealing surface(s) in the above-described manner takes a long time and requires an increased manufacturing lead time to accomplish the coupling of two housing bodies. Furthermore, applying the FIPG on the sealing surface(s) places a heavy burden on workers and requires careful management with respect to the applying amount.

Furthermore, according to the electronic component housing structural body such as the above-described conventional power control unit, the coupled housing bodies must be separated again if any damage or problem occurs inside the structural body so that the housing body including a damaged or problematic electronic component can be removed and replaced as a unit. However, the housing bodies are tightly fixed together by the FIPG that has already hardened. Thus, separation of the housing bodies is necessarily accompanied by troublesome work for removing or peeling the hardened FIPG off the sealing surfaces of the housing bodies. Hence, the sealing surfaces may be scratched or damaged if the work is done roughly. For example, a worker may use a screwdriver to forcibly separate the connected housing bodies, and may use a scraper to peel the FIPG off the sealing surfaces. In such a case, the sealing surfaces possibly have scratches and water leakage may occur due to the scratches. Thus, the housing bodies are no longer suitable to newly apply the FIPG on their sealing surfaces to connect the housing bodies again. Therefore, the power control unit, i.e., the electronic component housing structural body, must be removed as a unit or assembly to be replaced at that time.

Furthermore, an O-ring serving as a member constituting an inverter device proposed in Japanese Patent Laid-open Application No. Hei 10-213366 cannot be used to seal the joining surfaces of the above-described electronic component housing structural body. At least three O-rings must be disposed on the sealing surface(s) to independently seal the communicating passage area and the liquid passage area from the outside at the fitting faces of the housing bodies. The total number of constituent components thus increases, and the manufacturing cost also increases. Furthermore, disposing three O-rings on the sealing surface(s) is not practical in view of manufacturing workability.

SUMMARY OF THE INVENTION

The present invention provides an electronic component housing structural body including a first housing body including a housing chamber configured to accommodate at least one electronic component, a second housing body including a housing chamber configured to accommodate at least one electronic component, and fitting plane defined as the boundary of the first and the second housing bodies being coupled together. The fitting plane include a liquid passage area and a communicating passage area. The liquid passage area includes a cooling passage in which cooling liquid flows. The communicating passage area includes a communicating passage that connects the housing chamber of the first housing body and the housing chamber of the second housing body. An integrally formed sealing member is disposed on the fitting plane of the first and second housing bodies to independently surround and seal the liquid passage area and the communicating passage area.

With this arrangement, in the above-described electronic component housing structural body, the liquid passage area and the communicating passage area can be independently sealed by the single sealing member disposed between the fitting faces.

According to the present invention, it is preferable that the sealing member for the electronic component housing structural body is an O-ring having a circular cross section. The O-ring can easily deform into an elliptic shape when the first and second housing bodies are coupled. Thus, the O-ring can assure reliable sealing properties for an inner clearance between the housing bodies.

Furthermore, it is preferable that the electronic component housing structural body further includes a grove formed on one sealing surface of the first and second housing bodies, wherein the O-ring is held in the groove. With this arrangement, the O-ring can be held stably in the groove formed on the sealing surface when the housing bodies are coupled. The groove can facilitate stable placing of the O-ring in position relative to the sealing surface when the housing bodies are coupled. Furthermore, the O-ring does not deform beyond the depth of the groove formed on the sealing surface. This surely prevents the O-ring from excessively deforming and accordingly eliminates the possibility of deteriorating the sealing properties due to excessive deformation of the O-ring.

BRIEF DESCRIPTION OF THE DRAWINGS

The accompanying drawings, which are incorporated in and constitute a part of the specification, illustrate an embodiment of the invention and, together with the description, serve to explain the principles of the invention, in which.

DESCRIPTION OF PREFERRED EMBODIMENT

An embodiment of the present invention will be described below with reference to the drawings.

Figure 1:
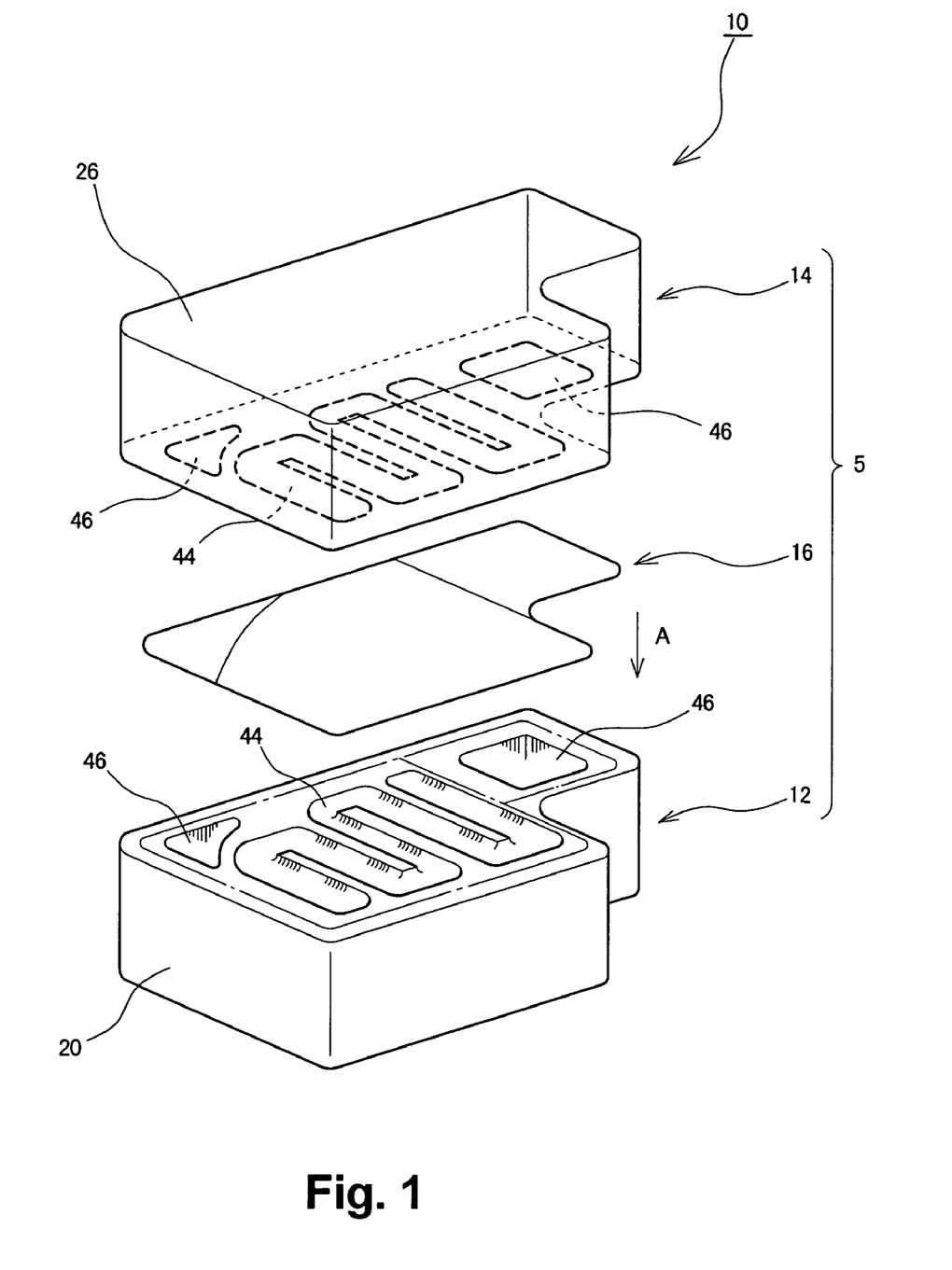
FIG. 1 is an exploded perspective view showing a schematic arrangement of a structural body that accommodates electronic components in accordance with one embodiment of the present invention.
Figure 2:
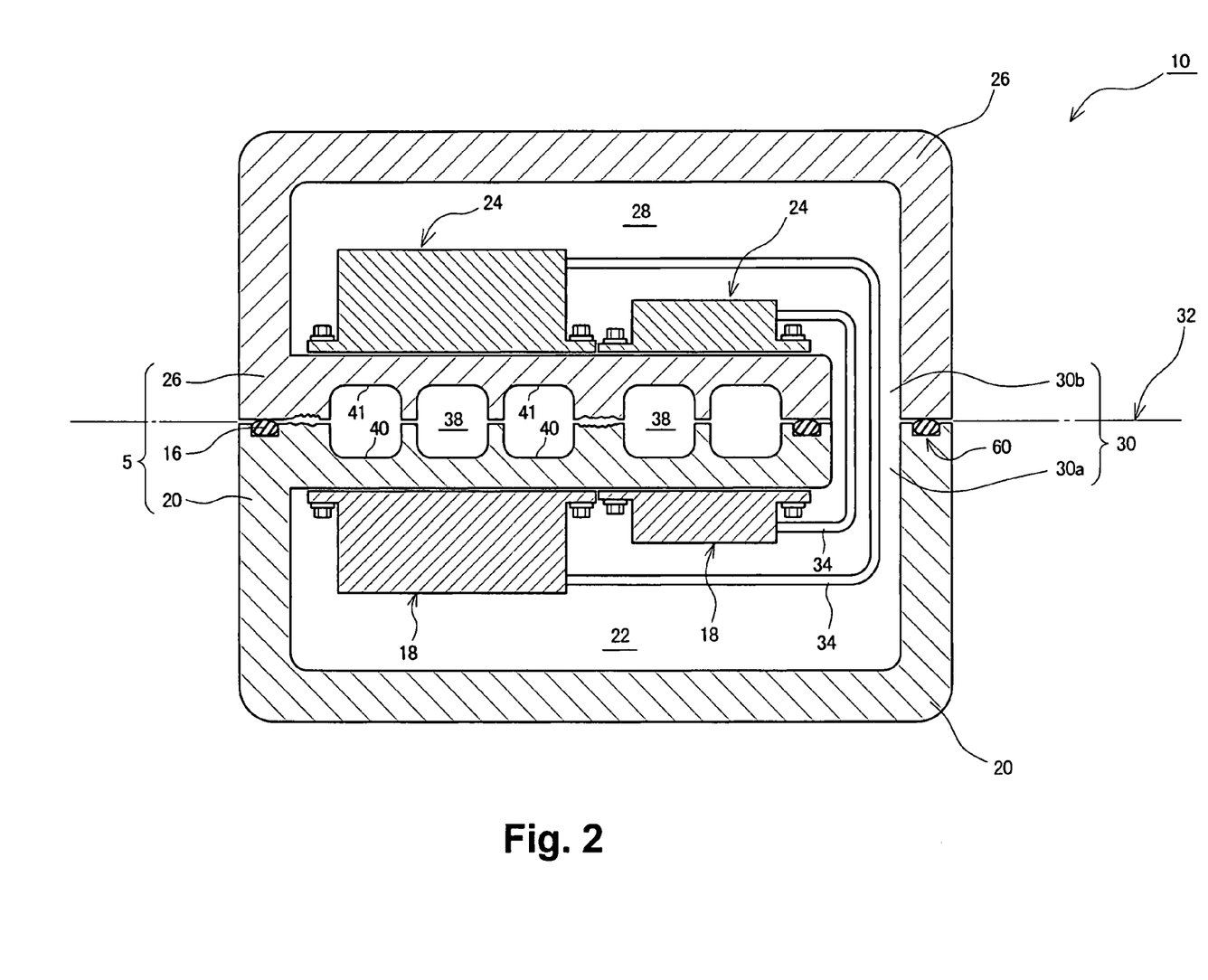
FIG. 2 is a vertical cross-sectional view showing the structural body that accommodates electronic components in accordance with the embodiment of the present invention.
Figure 3:
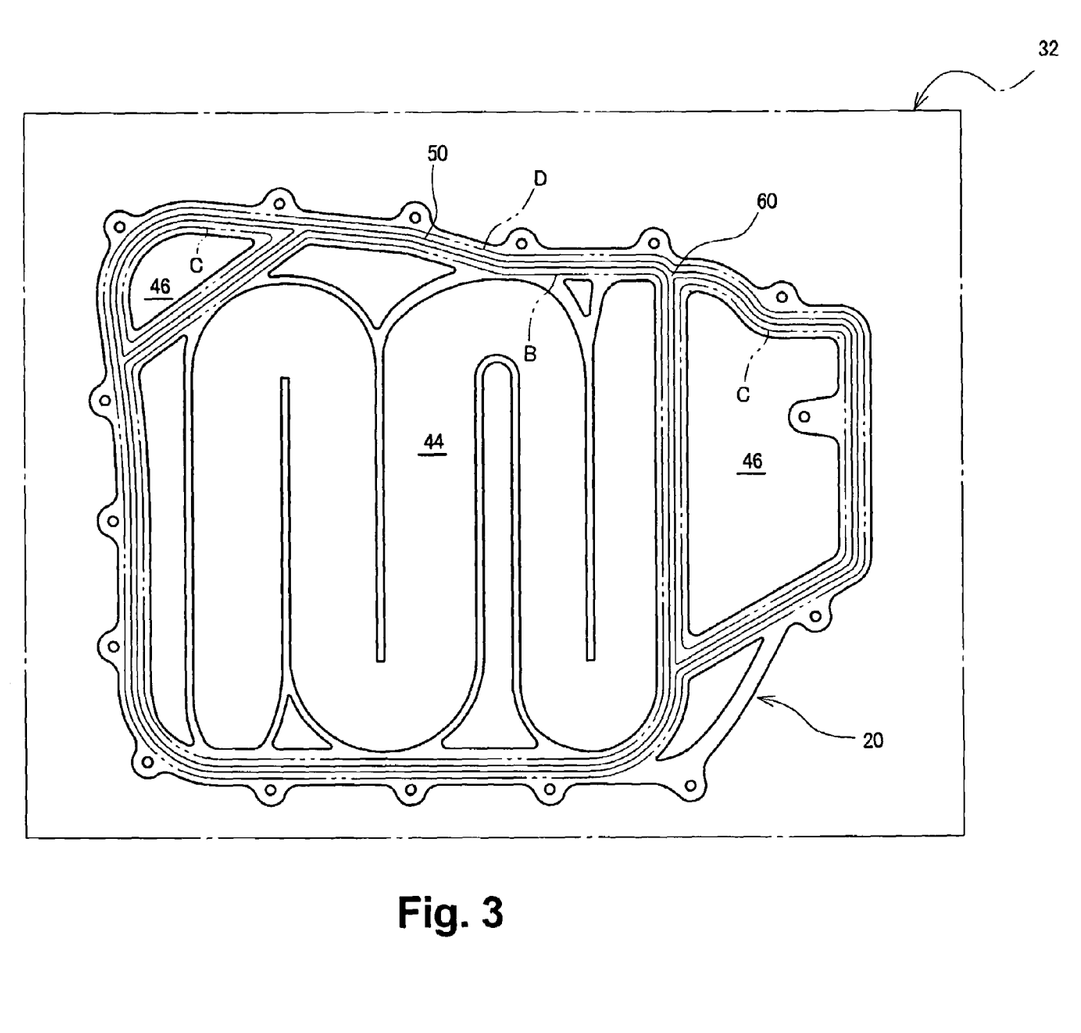
FIG. 3 is a plan view showing a converter housing body in accordance with the embodiment of the present invention.

A power control unit 10 according to one embodiment of the present invention employs a structural body 5 that can accommodate electronic components. FIG. 1 is an exploded perspective view showing the power control unit 10, although only the external appearance of components is shown. FIG. 2 is a vertical cross-sectional view showing the power control unit 10. FIG. 3 shows a fitting plane of a converter housing body, seen from a direction of arrow A shown in FIG. 1.

The power control unit 10 functions as a device that can supply electrical power to a hybrid power plant (e.g., a combined electric motor/internal combustion engine) and can control an electrical power supply amount. As shown in FIG. 1, the power control unit 10 includes a boosting converter section 12 and a driving inverter section 14. The boosting converter section 12 can boost a DC voltage supplied from a battery. The driving inverter section 14 can convert a boosted DC voltage into an AC voltage and can supply the converted AC voltage to the electric motor. The driving inverter section 14 and the boosting converter section 12 have joining surfaces that can be coupled with each other via a rubber-made O-ring 16 (i.e., a sealing member) and can be fixed together by means of bolts or the like (not shown) The boosting converter section 12, as shown in FIG. 2, includes converter components 18 and a converter housing body 20. The converter components 18 are electronic components constituting a converter. The converter housing body 20 can accommodate the converter components 18. The "electronic components" of the present embodiment include a board on which electronic elements are mounted and a casing of the board. The converter housing body 20 is an aluminum die-cast product that has an inside space configured into a converter installation chamber 22 in which the converter components 18 are placed. The converter installation chamber 22 has an inner wall on which the converter components 18 are fixed by means of bolts. Similarly, the driving inverter section 14 includes inverter components 24 and an inverter housing body 26. The inverter components 24 are electronic components constituting an inverter. The inverter housing body 26 can accommodate the inverter components 24. The inverter housing body 26 has an inside space configured into an inverter installation chamber 28 in which the inverter components 24 are placed.

As described above, the electronic component housing structural body 5 of the present embodiment includes the inverter housing body 26 and the converter housing body 20 serving as first and second housing bodies that can respectively accommodate electronic components. Furthermore, the electronic component housing structural body 5 includes the O-ring 16 serving as a sealing member sandwiched between the inverter housing body 26 and the converter housing body 20.

As shown in FIG. 2, the converter housing body 20 has a communicating passage 30a. The inverter housing body 26 has a communicating passage 30b. The communicating passages 30a and 30b, when connected with each other, can provide a continuous passage extending from the converter installation chamber 22 to the inverter installation chamber 28. The communicating passages 30a and 30b formed in the housing bodies 20 and 26 have opening ports identical in shape (cross section) at the fitting plane 32 of two housing bodies 20 and 26. Coupling the housing bodies 20 and 26 together can form one communicating passage 30 connecting the converter installation chamber 22 and the inverter installation chamber 28. In the embodiment, the "fitting plane" is defined as the boundary between two housing bodies being coupled together.

To connect the inverter components 24 in the housing chamber 28 and the converter components 18 in the housing chamber 22, bus bars 34 are disposed in the communicating passage 30. The bus bars 34 extending in the communicating passage 30 can supply boosted electrical power from the converter components 18 to the inverter components 24. A higher voltage is generally applied to the bus bars 34. To eliminate leakage of electrical power, the communicating passage 30 must have a water-proof structure. If necessary, a plurality of communicating passages can be provided in one housing body, as shown in FIG. 3.

Furthermore, to cool the electronic components 18 and 24 installed in the housing chambers 22 and 28, the power control unit 10 includes a cooling passage 38 in which the coolant circulates. The cooling passage 38 is provided on the fitting plane 32 of the converter section 12 and the inverter section 14. More specifically, the cooling passage 38 consists of a cooling groove 40 formed on the converter housing body 20 and a cooling groove 41 formed on the inverter housing body 26. The cooling grooves 40 and 42, as shown in FIG. 2, are U-shaped grooves formed on the fitting plane 32 of the converter housing body 20 and the inverter housing body 26.

The cooling grooves 40 and 41, as shown in FIG. 2, are formed in the region corresponding to the converter components 18 and the inverter components 24 installed in the housing chambers 22 and 28. Furthermore, the cooling grooves 40 and 41 are serpentine and extend on the fitting plane 32 of the housing bodies 20 and 26 as shown in FIG. 3. When the converter housing body 20 and the inverter housing body 26 are coupled at the fitting plane 32, the cooling passage 38 can be formed to have a rectangular cross section as shown in FIG. 2. The cooling groove 40 constitutes a side wall of the cooling passage 38. To facilitate heat dissipation, fins can be integrally formed on the cooling groove 40.

The coolant flowing in the cooling passage 38 is, for example, cooling water circulating in a radiator (not shown). The heat, generated from the converter components 18 and the inverter components 24 installed in the housing chambers 22 and 28, can be transferred via the housing bodies 20 and 26 to the cooling water flowing in the cooling passage 38. The cooling water absorbs heat of the power control unit 10 and releases the heat to the radiator to establish a heat-dissipation cycle, and circulates in the cooling passage 38 and the radiator to repeat the cycle. Thus, the inverter components 24 and the converter components 18 can be cooled down to suppress the increase in their temperatures.

As shown in FIG. 3, the fitting plane 32 comprises a liquid passage area 44 and a communicating passage area 46. The cooling passage 38 is positioned in a liquid passage area 44 encircled by an alternate long and two short dashes line B. The communicating passage 30 is positioned in a communicating passage area 46 encircled by an alternate long and two short dashes line C.

The liquid passage area 44 and the communicating passage area 46 are independent from each other and completely separated in the fitting plane 32 of the converter housing body 20 and the inverter housing body 26. The liquid passage area 44 is filled with cooling water to cool the electronic components 18 and 24. On the other hand, the communicating passage area 46 must have water-proof properties for the housing chambers 22 and 28 in which the electronic components 18 and 24 are installed.

Furthermore, the communicating passage area 46, the liquid passage area 44, and the outer periphery of the housing are separated from each other by a sealing surface 50 on the fitting plane 32. More specifically, the sealing surface 50 can be defined as a region equivalent to an area encircled by an alternate long and two short dashes line D shown in FIG. 3 subtracted by the areas encircled by the alternate long and two short dashes lines B and C. The sealing surface 50, formed on the fitting plane 32 of the housing bodies, have a predetermined surface roughness that can be obtained by machining. The sealing surface 50 is provided along the periphery of the structural body 5 to independently surround the liquid passage area 44 and the communicating passage area 46. When the housing bodies 20 and 26 are coupled, the sealing surfaces 50 are brought into contact with each other.

However, to ensure water-proof properties, a sealing member must be disposed between the sealing surfaces 50 of the housing bodies 20 and 26. Even if the sealing surfaces 50 are finished to have a required surface roughness, the sealing surfaces 50 cannot surely seal the liquid passage area 44 and the communicating passage area 46.

Figure 4:
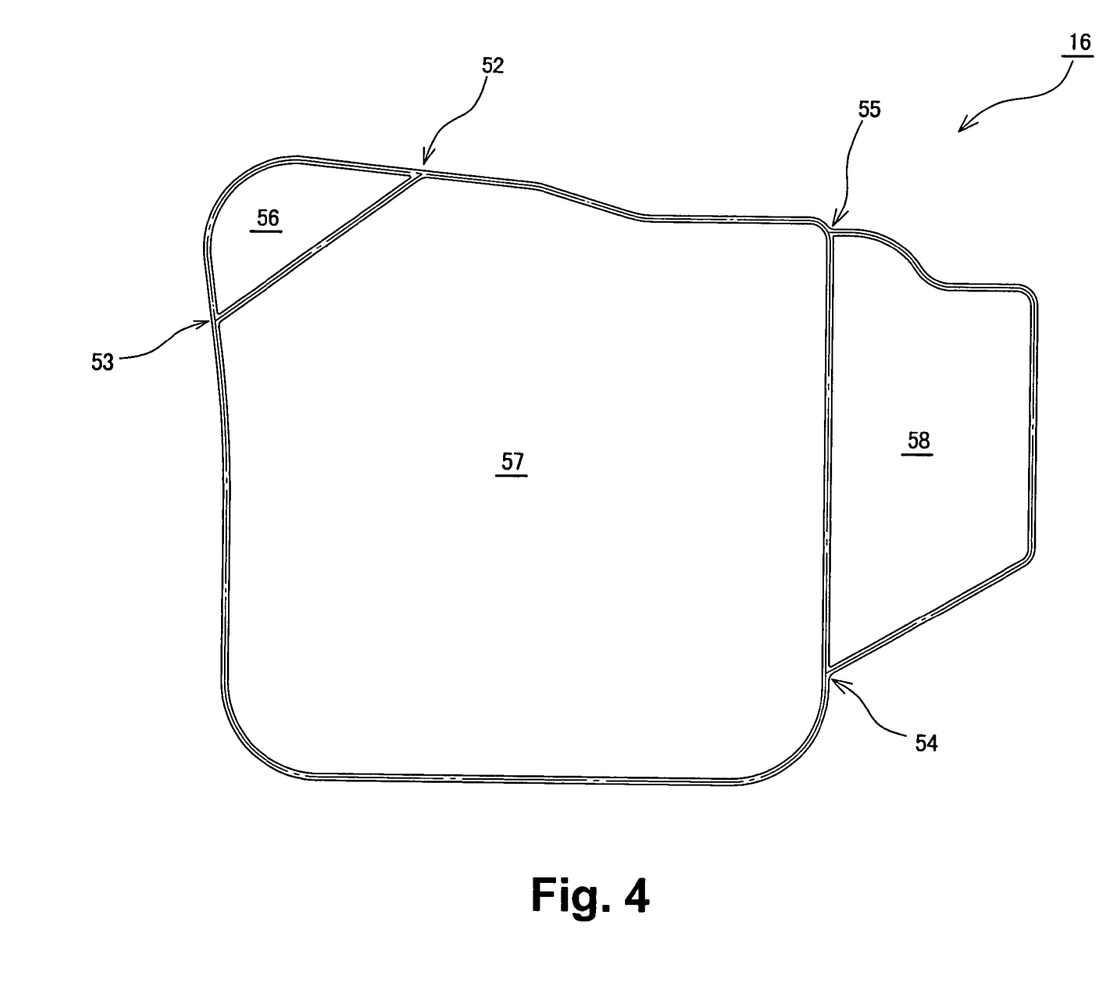
FIG. 4 is a view showing an O-ring in accordance with the embodiment of the present invention.

In the electronic component housing structural body 5 of the present embodiment, an O-ring 16 having a configuration shown in FIG. 4 is provided between the sealing surfaces 50 to ensure the sealing properties of the liquid passage area 44 and the communicating passage area 46 in the fitting plane 32. The O-ring 16 is a synthetic rubber member having a circular cross section. The O-ring 16 includes Y-shaped branched portions 52, 53, 54, and 55 to form a predetermined shape surrounding the above-described three areas 56, 57, and 58. In the embodiment, two communicating passage areas 46 and one liquid passage area 44 in the fitting plane 32 shown in FIG. 3 can be independently surrounded by the O-ring 16.

Furthermore, a groove 60 having a shape corresponding to the O-ring 16 is formed on one sealing surface 50 of two housing bodies 20 and 26. In the embodiment, as shown in FIGS. 2 and 3, the sealing surface 50 of the converter housing body 20 has the groove 60. The groove 60 has a depth smaller than a diameter of the O-ring 16. The groove 60 has an appropriate height so that the groove 60 is filled (at a predetermined rate) with the O-ring 16 compressed between the sealing surfaces 50 when the housing bodies 20 and 26 are coupled together. Alternatively, the groove can be formed on the sealing surface 50 of the other housing body (i.e., of the inverter housing body 26), and the O-ring 16 can be disposed in this groove similarly.

When the housing bodies 20 and 26 are tightly coupled by means of bolts, the O-ring 16 undergoes an elastic deformation under a compression force applied from the sealing surface 50 of the inverter housing body 26 and the groove 60 of the converter housing body 20. Thus, the O-ring 16 deforms into an elliptic shape. In other words, the O-ring 16 can exert a predetermined pressure on the sealing surface 50 of the inverter housing body 26 and on the groove 60 formed on the sealing surface 50 of the converter housing body 20, thereby enhancing the sealing properties for respective contact portions.

Thus, the O-ring 16 contacts the sealing surface 50, in such a manner that the liquid passage area 44 and the communicating passage area 46 are independently surrounded by the O-ring 16. The liquid passage area 44 and the communicating passage area 46 are independently sealed in the fitting plane 32 from the outside.

In this manner, in the fitting plane 32 of the housing bodies 20 and 26, the O-ring 16 can prevent cooling water entering from the liquid passage area 44 into the communicating passage area 46. In addition, the O-ring 16 can prevent the water from entering into the power control unit 10 from the outside. Ensuring water-proof properties for the communicating passage area 46 in the fitting plane 32 facilitates elimination of water entering into the housing chambers 22 and 28 formed in the housing bodies. Thus, the electronic components 18 and 24 can be kept in a fluid-tight state.

Furthermore, at the fitting plane 32, the O-ring 16 can eliminate leakage of cooling water that flows in the liquid passage area 44. Thus, the cooling water cannot go beyond an inner clearance between two housing bodies 20 and 26 that are brought into contact with each other to have a predetermined surface roughness. No water can leak out of the sealing surface 50 surrounding the liquid passage area 44, and no water can reach the communicating passage area 46 or the outer periphery of the housing body. Thus, an appropriate amount of cooling water can be constantly maintained.

According to the above-described electronic component housing structural body of the present embodiment, a single sealing member is disposed on the fitting plane 32 of two housing bodies 20 and 26. The sealing member can independently seal the liquid passage area 44 and the communicating passage area 46 in the fitting plane 32 when the housing bodies 20 and 26 are coupled. Accordingly, in the process of manufacturing the power control unit 10, assembling workability can be improved because the inverter housing body 26 and the converter housing body 20 can be easily coupled.

In addition, the electronic component housing structural body of the present embodiment is simple compared with the above-described conventional arrangement because troublesome work for coating the FIPG is no longer required when the housing bodies are coupled. Quality management for the fitting plane 32 of the housing bodies can be simplified, and the manufacturing cost for the electronic component housing structural body can be reduced.

Furthermore, the electronic component housing structural body of the present embodiment can facilitate removing a damaged or problematic electronic component because any one of the electronic components accommodated in the housing chambers can be easily taken out by simply disengaging one housing body from the other. The electronic component housing structural body of the present embodiment can simplify replacement work because only one housing body including a problematic or damaged electronic component can be removed from the other which is left stationary. Therefore, if any trouble occurs in the electronic component housing structural body, the work to be done by a worker is replacing only one housing body that accommodates a problematic or damaged electronic component. Thus, the workability in replacement work can be improved.

Furthermore, the electronic component housing structural body of the present embodiment includes, as a sealing member, the rubber-made O-ring 16 that has a circular cross section and can easily deform when compressed. The rubber-made O-ring 16 can water-tightly contact with the sealing surfaces 50 of the housing bodied.

Furthermore, the electronic component housing structural body of the present embodiment includes the groove 60 formed on one sealing surface 50 of two housing bodies 20 and 26. The groove 60 can stably hold the O-ring 16. The groove 60 facilitates stably placing the O-ring 16 in position relative to the sealing surface 50 when the housing bodies 20 and 26 are coupled. Furthermore, the O-ring 16 does not deform beyond the depth of groove 60 formed on the sealing surface 50. This surely prevents the O-ring 16 from excessively deforming and accordingly eliminates the possibility of deteriorating the sealing properties due to excessive deformation of the O-ring 16.

In the electronic component housing structural body of the present embodiment, the sealing member is not limited to the disclosed O-ring 16 that has a circular cross section.

Accordingly, any other comparable elastic member can be used to independently surround the liquid passage area and the communicating passage area, as long as it can assure sufficient water-proof properties when disposed between two housing bodies. For example, a plate sealing member can be used. The present invention is not limited to the above-described embodiment and can be modified in various ways within the scope of the present invention.

According to the present invention, in manufacturing the above-described electronic component housing structural body, the workability can be improved because the first and second housing bodies can be easily coupled at the fitting plane, and the manufacturing cost can be reduced.

While the present invention has been described with reference to an exemplary embodiment, it is to be understood that the invention is not limited to the disclosed exemplary embodiment. The scope of the following claims is to be accorded the broadest interpretation so as to encompass all modifications, equivalent structures and functions.

What is claimed is:

1. An electronic component housing structural body comprising:

a first housing body including a housing chamber configured to accommodate at least one electronic component;

a second housing body including a housing chamber configured to accommodate at least one electronic component; and fitting plane defined as the boundary of the first and the second housing bodies being coupled together, wherein the fitting plane of the first and second housing bodies comprise: a liquid passage area including a cooling passage in which cooling liquid flows; and a communicating passage area including a communicating passage that connects the housing chamber of the first housing body and the housing chamber of the second housing body, and an integrally formed sealing member is disposed on the fitting plane to independently surround and seal the liquid passage area and the communicating passage area.

2. The electronic component housing structural body according to claim 1, wherein the sealing member is an O-ring having a circular cross section.

3. The electronic component housing structural body according to claim 2, further comprising a groove formed on one sealing surface of the first and second housing bodies, wherein the O-ring is held in the groove.

* * * * *